(12) United States Patent
Rachmady et al.

(10) Patent No.: US 10,347,767 B2
(45) Date of Patent: Jul. 9, 2019

(54) TRANSISTOR WITH A SUBFIN LAYER

(71) Applicant: Intel Corporation, Santa Clara, CA (US)

(72) Inventors: Willy Rachmady, Beaverton, OR (US); Matthew V. Metz, Portland, OR (US); Van H. Le, Portland, OR (US); Ravi Pillarisetty, Portland, OR (US); Gilbert Dewey, Beaverton, OR (US); Jack T. Kavalieros, Portland, OR (US); Ashish Agrawal, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/570,742

(22) PCT Filed: Jun. 16, 2015

(86) PCT No.: PCT/US2015/036087
§ 371 (c)(1),
(2) Date: Oct. 30, 2017

(87) PCT Pub. No.: WO2016/204737
PCT Pub. Date: Dec. 22, 2016

(65) Prior Publication Data
US 2018/0204947 A1 Jul. 19, 2018

(51) Int. Cl.
*H01L 29/78* (2006.01)
*H01L 29/66* (2006.01)
(Continued)

(52) U.S. Cl.
CPC .... *H01L 29/7851* (2013.01); *H01L 21/02639* (2013.01); *H01L 21/76224* (2013.01); *H01L 29/0649* (2013.01); *H01L 29/1037* (2013.01); *H01L 29/1054* (2013.01); *H01L 29/66522* (2013.01); *H01L 29/66545* (2013.01); *H01L 29/66795* (2013.01); *H01L 29/78* (2013.01);
(Continued)

(58) Field of Classification Search
CPC ............. H01L 29/1037; H01L 29/1054; H01L 29/7851
See application file for complete search history.

(56) References Cited

U.S. PATENT DOCUMENTS 9,159,824 B2 * 10/2015 Lee .................. H01L 29/66431
2007/0235763 A1 10/2007 Doyle et al.
(Continued)

FOREIGN PATENT DOCUMENTS

KR  1020070070932  7/2007

OTHER PUBLICATIONS

International Preliminary Report on Patentability for International Patent Application No. PCT/US2015/036087, dated Dec. 28, 2017, 12 pages.
(Continued)

*Primary Examiner* — Dung A. Le
(74) *Attorney, Agent, or Firm* — Schwabe, Williamson & Wyatt, P.C.

(57) ABSTRACT

A subfin layer is deposited in a trench in an insulating layer on the substrate. A fin is deposited on the subfin layer. The fin has a top portion and opposing sidewalls. The fin comprises a first semiconductor material. The subfin layer comprises a III-V semiconductor material.

19 Claims, 14 Drawing Sheets

(51) Int. Cl.
*H01L 29/10* (2006.01)
*H01L 21/02* (2006.01)
*H01L 21/762* (2006.01)
*H01L 29/06* (2006.01)

(52) U.S. Cl.
CPC ........ *H01L 29/785* (2013.01); *H01L 29/7848* (2013.01)

(56) References Cited

U.S. PATENT DOCUMENTS

| | | |
|---|---|---|
| 2013/0043506 A1 | 2/2013 | Tsai et al. |
| 2013/0175659 A1 | 7/2013 | Liu |
| 2013/0234147 A1 | 9/2013 | Wu et al. |
| 2016/0005656 A1* | 1/2016 | Ching ............. H01L 21/823821 438/283 |
| 2016/0208141 A1* | 7/2016 | Ho ............................ C09G 1/00 |
| 2016/0225673 A1* | 8/2016 | Niimi .............. H01L 21/823807 |
| 2018/0122946 A1* | 5/2018 | Holland .............. H01L 29/7851 |

OTHER PUBLICATIONS

International Search Report and Written Opinion for International Application No. PCT/US2015/036087 dated Mar. 16, 2016, 15 pgs.

* cited by examiner

TRANSISTOR WITH A SUBFIN LAYER

CROSS-REFERENCE TO RELATED APPLICATION

This patent application is a U.S. National Phase Application under 35 U.S.C. § 371 of International Application No. PCT/US2015/036087, filed Jun. 16, 2015, entitled "A TRANSISTOR WITH A SUBFIN LAYER," which designates the United States of America, the entire disclosure of which is hereby incorporated by reference in its entirety and for all purposes.

FIELD

Embodiments as described herein relate to a field of electronic device manufacturing, and in particular, to transistor manufacturing.

BACKGROUND

Scaling of features in integrated circuits enables increased densities of electronic devices on the limited real estate of the integrated circuit chip. Generally, the performance of electronic devices on the integrated circuit chip (e.g., transistors, resistors, capacitors, etc) is a major factor considered during scaling of those devices. Generally, a non-planar transistor architecture (e.g., FinFET, Trigate, Gate-All-Around (GAA)) refers to an architecture where the transistor channel is surrounded by one or more gates on multiple surfaces. Typically, a non-planar transistor has a fin grown on a silicon substrate. Many techniques have been developed to manufacture devices with non-Si channel materials, e.g., Ge, SiGe, and III-V materials. Significant process improvements, however, are still needed to integrate these materials onto Si wafers.

As the transistors scale down, the transistors increasingly suffer from the undesirable subfin leakage current that negatively impacts the device performance. One method to suppress the leakage current in a subfin layer of the non-planar device is to implant a dopant into the subfin layer to form a junction isolation. This method is not scalable and becomes harder to implement for current and future logic transistor technologies as the size of the devices decreases and the density of the devices increases. For example, in a germanium (Ge) p-type Metal Oxide Semiconductor (PMOS) device, the subfin layer is doped with a n-type dopant species (e.g., arsenic (As) and phosphorous (P)) to form a junction isolation. As the diffusion speed of the n-type dopant species in Ge is very fast it is very difficult to achieve an abrupt junction and it is impossible to contain the diffusion of the n-type species into the channel region.

Another solution to suppress the leakage current in the subfin layer of the Ge non-planar transistor is to use a silicon germanium (SiGe) as the subfin layer. Because of the lattice constant mismatch between Ge and SiGe, the Ge channel is strained and the channel thickness is limited to the critical thickness to which Ge can be grown on SiGe. This limits the fin thickness. For example, there can only be 20 nm or less of Ge on $Si_{30}Ge_{70}$ before the Ge film quality degrades due to formation of misfit dislocations. Additionally, a parallel conduction in SiGe prohibits scaling the channel length to the dimensions relevant to the current and future technology requirements.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

Figure 1A:
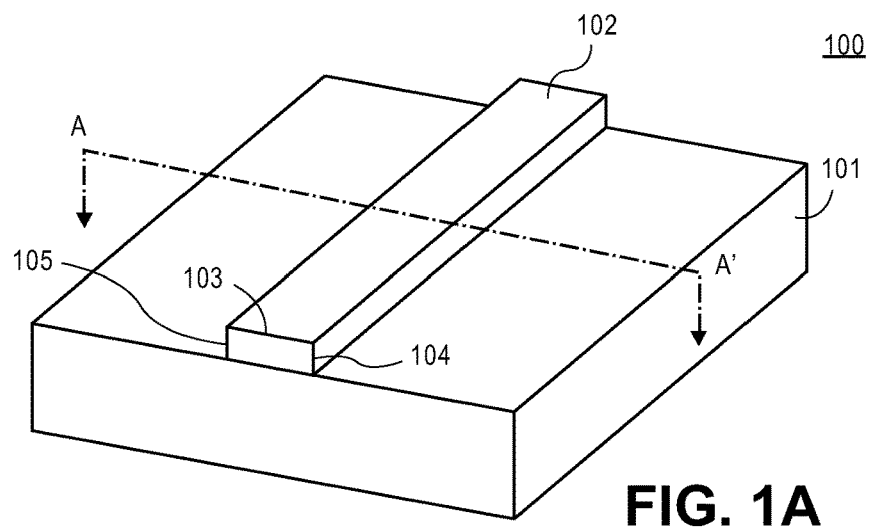
FIG. 1A shows a perspective view of a portion of an electronic device according to one embodiment.

Methods and apparatuses to manufacture a transistor with a subfin layer are described. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Embodiments of a transistor comprising a first semiconductor material as a channel and a III-V semiconductor material as a subfin material in an aspect ratio trapping (ART) trench structure are described. In one embodiment, the transistor is a non-planar transistor, e.g., a trigate transistor, a FinFET transistor, or any other non-planar transistor.

A subfin layer is deposited in a trench in an insulating layer on the substrate. A fin is deposited on the subfin layer. The fin has a top portion and opposing sidewalls. The fin comprises the first semiconductor material. The subfin layer comprises the III-V semiconductor material. In one embodiment, the first semiconductor material and the III-V semiconductor have similar lattice constants. In one embodiment, the lattice mismatch between the first semiconductor material and the III-V semiconductor material is not greater than 0.1%. In one embodiment, the III-V semiconductor material has a wide band gap (Eg) of at least 1.4 electron volts (eV) at 300K. In one embodiment, the difference between a band gap of the III-V semiconductor material and a band gap of the first semiconductor material (e.g., valence band offset) is at least 0.25 eV. In one embodiment, the valence band offset (VBO) between the first semiconductor material and the III-V semiconductor material is greater than 0.25 eV. In one embodiment, the III-V material of the subfin layer provides a barrier to confine carriers in the first semiconductor material channel to cut-off any parasitic current leakage through the subfin material and turn off the transistor only by the gate.

In one embodiment, the III-V semiconductor material acts as a barrier layer for holes conduction and thus can advantageously eliminate the parallel conduction between a source region and a drain through the un-gated subfin region.

Unlike with conventional techniques, the thickness of the first semiconductor material channel grown on the III-V semiconductor is advantageously not limited to 20 nm. Furthermore, the III-V semiconductor material advantageously does not require doping to provide a subfin barrier for the first semiconductor material.

In one embodiment, the trigate transistor comprises a Ge layer as a channel on a GaAs layer as a subfin material grown in an ART trench on a Si substrate. Because of the large VBO between Ge and GaAs (e.g., greater than 0.4 eV), a natural barrier for parallel conduction between a source region and a drain region in the subfin layer is formed. The presence of the barrier provides an advantage as this barrier enables the channel length to be scaled down to less than 20 nm. Furthermore, the Ge-on-GaAs fin structure provides an advantage over existing techniques by enabling scaling of the gate length in the p-type Ge MOSFET transistor while maintaining a short channel control.

Figure 2A:
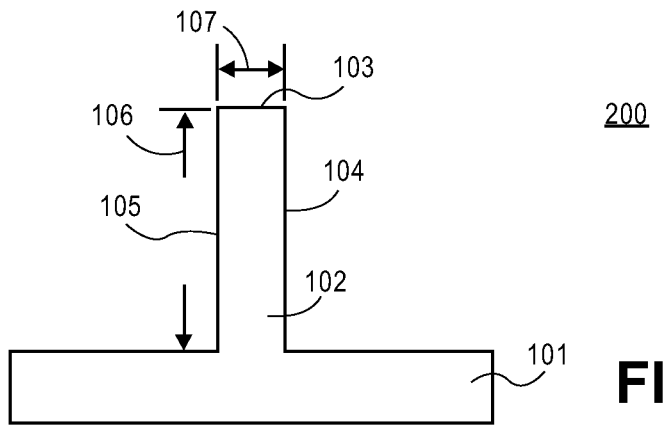
FIG. 2A shows a cross-sectional view of the portion of the electronic device shown in FIG. 1A along an axis A-A' according to one embodiment.

FIG. 1A shows a perspective view of a portion of an electronic device 100 according to one embodiment. FIG. 2A shows a cross-sectional view 200 of the portion of the electronic device 100 along an axis A-A' according to one embodiment. Electronic device 100 comprises a fin 102 on a substrate 101. In an embodiment, the substrate 101 comprises a semiconductor material, e.g., silicon. In one embodiment, substrate 101 is a monocrystalline silicon ("Si") substrate. In another embodiment, substrate is a polycrystalline silicon substrate. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer substantially aligned along a predetermined crystal orientation, for example, (100) crystal plane. The top monocrystalline layer may comprise any material listed above, e.g., silicon. In an embodiment, substrate 101 is a silicon substrate substantially aligned along a (100) crystal plane ("Si (100)") with zero degree miscut. In an embodiment, substrate 101 a Si (100) substrate with a miscut of a predetermined degree (e.g., 2-10°) towards the [110]crystallographical direction to facilitate III-N material nucleation.

Fin 102 comprises a top portion 103 and opposing sidewalls 104 and 105. In one embodiment, fin 102 is a part of the substrate 101. In one embodiment, the fin 102 is a silicon fin. In one embodiment, fin 102 comprises the same material as of the substrate 101. In one embodiment, a width 107 is not greater than 100 nm. In one embodiment, the width 107 of the fin is from about 1 nanometers (nm) to about 200 nm. In more specific embodiment, the width 107 of the fin is from about 5 nm to about 20 nm. In one embodiment, the height 106 of the fin is at least twice greater than the width 107. In one embodiment, the fin 102 is formed by patterning and etching substrate 101 using one or more of the patterning and etching techniques known to one of ordinary skill in the art of electronic device manufacturing.

Figure 1B:
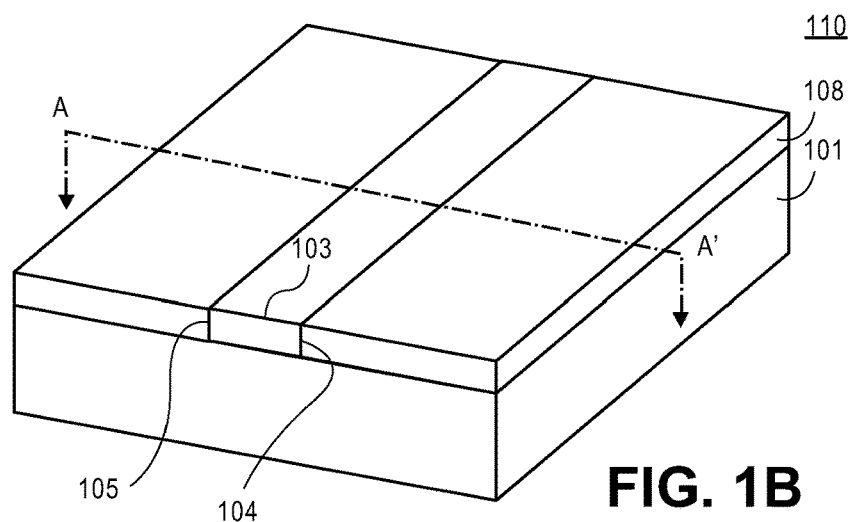
FIG. 1B is a view similar to FIG. 1A after an insulating layer is deposited on the substrate to expose a top portion of the fin according to one embodiment.
Figure 2B:
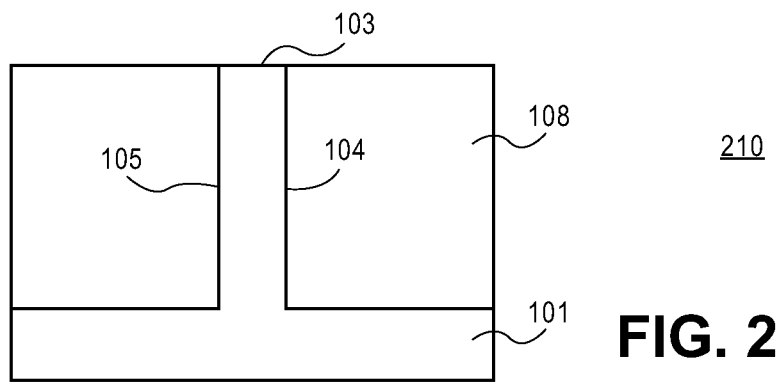
FIG. 2B shows a cross-sectional view of the portion of the electronic device shown in FIG. 1B along an axis A-A' according to one embodiment.

FIG. 1B is a view 110 similar to FIG. 1A after an insulating layer 108 is deposited on the substrate to expose the top portion 103 of the fin 102 according to one embodiment. FIG. 2B shows a cross-sectional view 210 of the portion of the electronic device shown in FIG. 1B along an axis A-A' according to one embodiment. In an embodiment, insulating layer 108 is a shallow trench insulating (STI) layer. In one embodiment, insulating layer 108 is an oxide layer, e.g., a silicon oxide layer. In another embodiment, insulating layer 108 is a nitride layer, e.g., silicon nitride layer. In alternative embodiments, insulating layer 108 is an aluminum oxide ("Al2O3"), silicon oxide nitride ("SiON"), other oxide/nitride layer, any combination thereof, or other electrically insulating layer determined by an electronic device design. As shown in FIGS. 1B and 2B, the insulating layer is deposited on substrate 101 and on sidewalls 104 and 105 of the fin. The thickness of the insulating layer is substantially equal to the height 106 of the fin 102.

In an embodiment, insulating layer 108 is blanket deposited on substrate 101 and top portion 103 and sidewalls 104 and 105 of the fin 102 using one of blanket deposition techniques, such as but not limited to a chemical vapour deposition ("CVD"), e.g., a plasma Enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. A portion of the insulating layer 108 is then removed to expose top portion 103 of the fin. In one embodiment, the portion of the insulating layer 108 is removed using one of the chemical-mechanical polishing (CMP) techniques known to one of ordinary skill in the art of electronic device manufacturing. In another embodiment, the portion of the insulating layer 108 is removed using one of the etching techniques known to one of ordinary skill in the art of electronic device manufacturing.

Figure 1C:
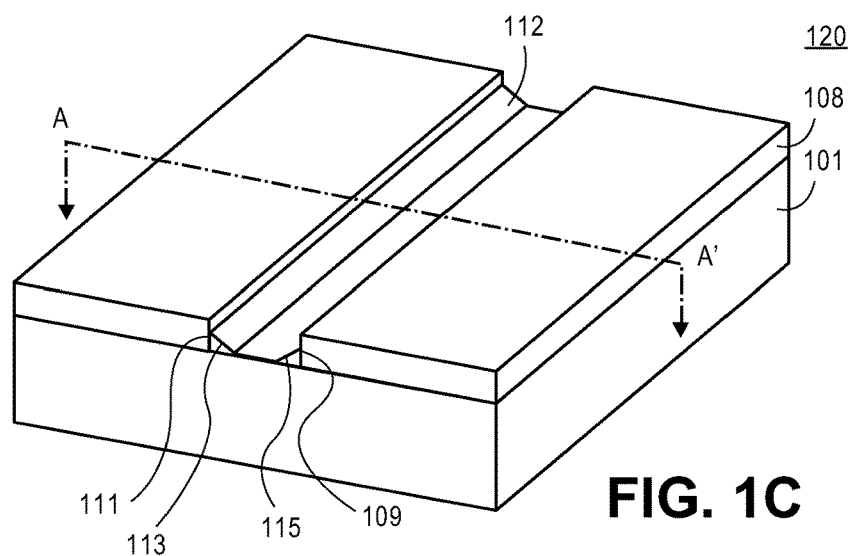
FIG. 1C is a view similar to FIG. 1B after the fin is etched to form a narrow trench according to one embodiment.
Figure 2C:
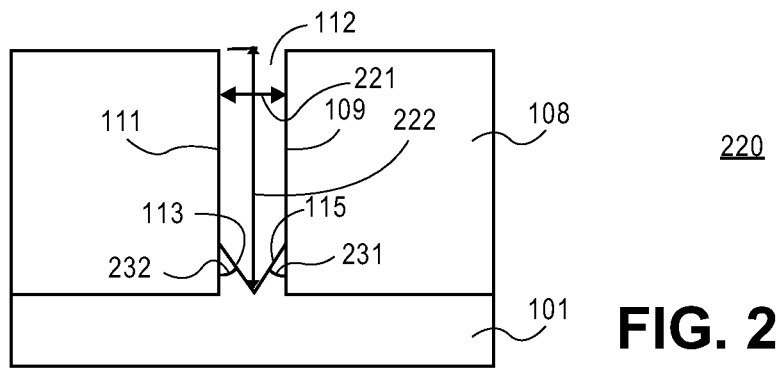
FIG. 2C shows a cross-sectional view of the portion of the electronic device shown in FIG. 1C along an axis A-A' according to one embodiment.

FIG. 1C is a view 120 similar to FIG. 1B after the fin 102 is etched to form a narrow trench according to one embodiment. FIG. 2C shows a cross-sectional view 220 of the portion of the electronic device shown in FIG. 1C along an axis A-A' according to one embodiment. As shown in FIGS. 1C and 2C, a trench 112 is formed in insulating layer 108. Trench 112 has sidewalls 109 and 111 and bottom portions 113 and 115. Bottom portion 115 extends from the substrate 101 to sidewall 109 at an angle 231. Bottom portion 113 extends from substrate 101 to sidewall 111 at an angle 232 forming a V-shape. In one embodiment, each of the angle 231 and 232 is about 55 degrees.

In another embodiment, the bottom portion of the trench has a bottom portion that is substantially parallel to the substrate, as shown in FIGS. 3A-3E described in further detail below. In one embodiment, the trench is formed by removing the fin 102 using a dry etching, a wet etching, or both dry and etching techniques known to one of ordinary skill in the art of electronic device manufacturing. In one embodiment, the silicon fin 102 is removed by an anisotropic wet etch using an etching solution e.g., ammonium hydroxide (NH4OH), tetramethylammonium hydroxide (TMAH), or both to form the V groove comprising bottom portions 115 and 113. In one embodiment, bottom portions 115 and 113 are formed along [111] facets of the Si fin 102 that act as surfaces for growing the III-V semiconductor material subfin later in a process.

In one embodiment, trench 112 is narrow enough to form the V-shape comprising bottom portions 115 and 113. In one embodiment, a width 221 of the trench 112 is not greater than 100 nm. In one embodiment, the width 221 is from about 1 nm to about 200 nm. In more specific embodiment, the width 221 is from about 5 nm to about 20 nm. In one embodiment, a depth 222 of the trench 112 is at least twice greater than the width 221 to provide the ART.

Figure 1D:
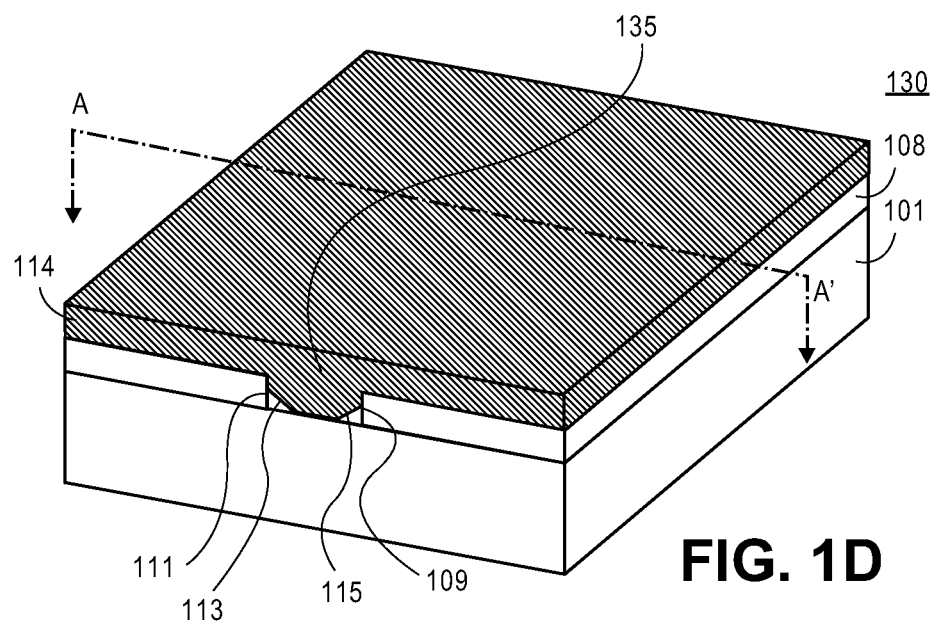
FIG. 1D is a view similar to FIG. 1C after a subfin layer is deposited within the trench in the insulating layer on the substrate according to one embodiment.
Figure 2D:
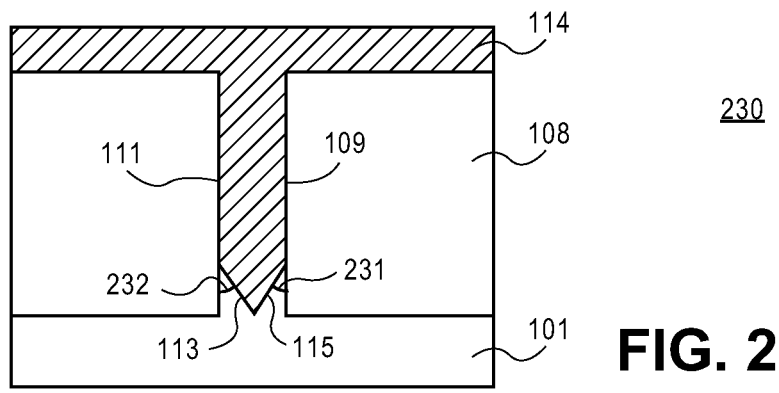
FIG. 2D shows a cross-sectional view of the portion of the electronic device shown in FIG. 1D along an axis A-A' according to one embodiment.

FIG. 1D is a view 130 similar to FIG. 1C after a subfin layer 114 is deposited within the trench 112 in the insulating layer 108 on the substrate 101 according to one embodiment. FIG. 2D shows a cross-sectional view 230 of the portion of the electronic device shown in FIG. 1D along an axis A-A' according to one embodiment. Subfin layer 114 is deposited on bottom portions 113 and 115 of the fin 102 on substrate 101, sidewalls 109 and 111 of the trench 112, and top portions of the insulating layer 108 to ensure a complete fill of the trench 112. In one embodiment, the subfin layer 114 comprises a III-V semiconductor layer. In more specific embodiment, subfin layer 114 is a GaAs layer. In alternative embodiments, subfin layer 114 is a GaAs layer, a GaInP layer, a AlAs layer, or any combination thereof.

Subfin layer 114 can be deposited using one of deposition techniques, such as but not limited to a chemical vapour deposition ("CVD"), e.g., a plasma Enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. In more specific embodiment, a GaAs epitaxial subfin layer is grown by a CVD or a MOCVD process to fill the trench 112. In one embodiment, the GaAs epitaxial subfin layer overgrows above the STI insulating layer 108 to ensure a complete fill of the trench 112, as shown in FIGS. 1D and 2D.

In one embodiment, the III-V compound semiconductor subfin layer 114 is grown
in trench 112 in insulating layer 108 of silicon oxide on the substrate 101 of silicon using a CVD or MOCVD process. As the subfin layer is grown in the trench 112, the misfit dislocations formed at an interface between the substrate 101 and subfin layer 114 are trapped by sidewalls 109 and 111 and do not propagate to a top portion 135 of the subfin layer 114. In one embodiment, the subfin layer 114 is directly grown on the bottom portions 113 and 115 extending at about 55 degrees angle to the substrate 101 to reduce anti-phase boundary (APB) defects and promote better nucleation of the subfin layer on the substrate.

Figure 1E:
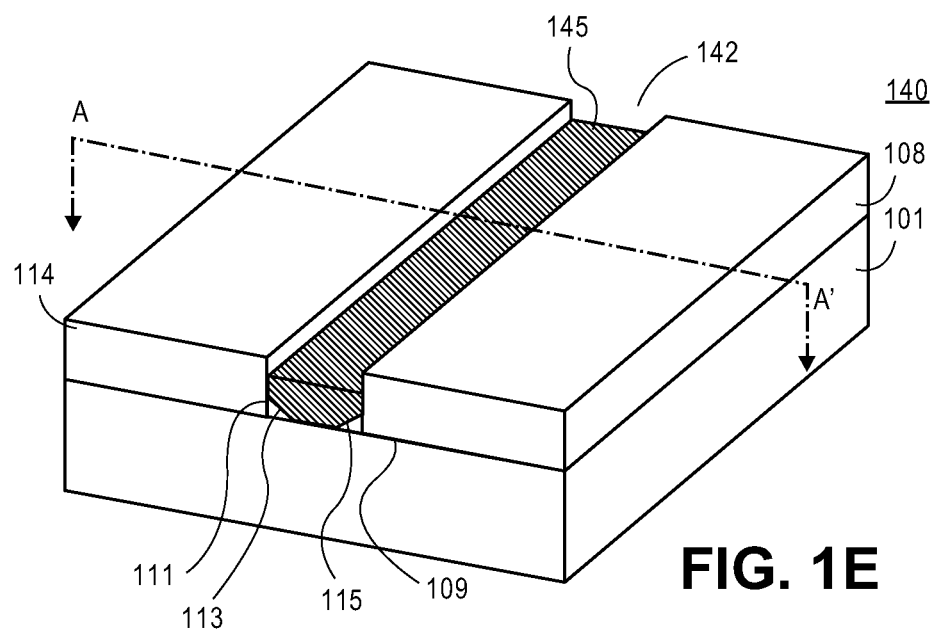
FIG. 1E is a view similar to FIG. 1D after the subfin layer is recessed according to one embodiment.
Figure 2E:
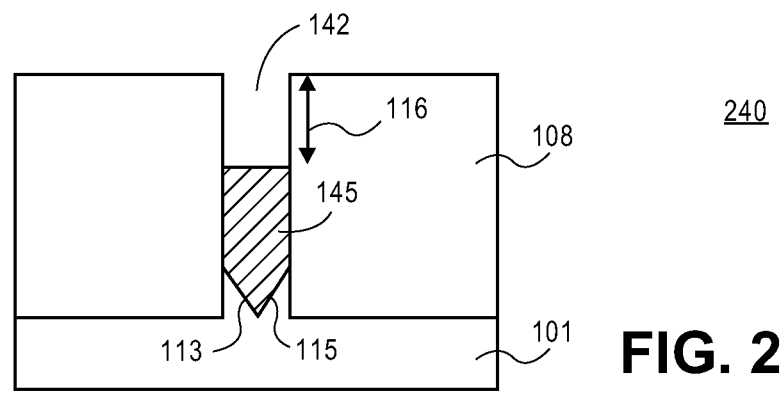
FIG. 2E shows a cross-sectional view of the portion of the electronic device shown in FIG. 1E along an axis A-A' according to one embodiment.

FIG. 1E is a view 140 similar to FIG. 1D after the subfin layer 114 is recessed according to one embodiment. FIG. 2E shows a cross-sectional view 240 of the portion of the electronic device shown in FIG. 1E along an axis A-A' according to one embodiment.

The subfin layer 114 is recessed within the trench 112 to a depth 116 to form a shallow trench 142. In one embodiment, a depth 116 of the trench 142 is determined by the thickness of a channel body formed later in a process. In one embodiment, depth 116 is from about 2 nm to about 100 nm. In more specific embodiment, depth 116 is about 40 nm. In one embodiment, the subfin layer is planarized using one of the CMP techniques known to one of ordinary skill in the art of electronic device manufacturing so that the subfin layer is flushed with the insulating layer 108. The subfin layer is then recessed within the trench 112 to form a recessed portion 145 by using a wet etching, dry etching, or both etching techniques known to one of ordinary skill in the art of electronic device manufacturing. In one embodiment, the subfin layer is recessed by a wet etch using ammonia hydroxide based solution. In another embodiment, the subfin layer is recessed by a dry etch using one or more halogen based chemistries (e.g., Cl2, HBr, or any combination thereof).

Figure 1F:
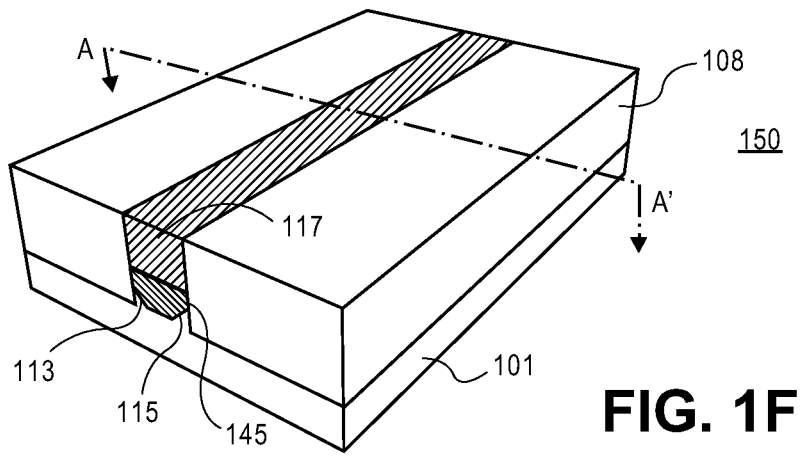
FIG. 1F is a view similar to FIG. 1E after a fin layer is deposited within a shallow trench on the recessed portion of the subfin layer according to one embodiment.
Figure 2F:
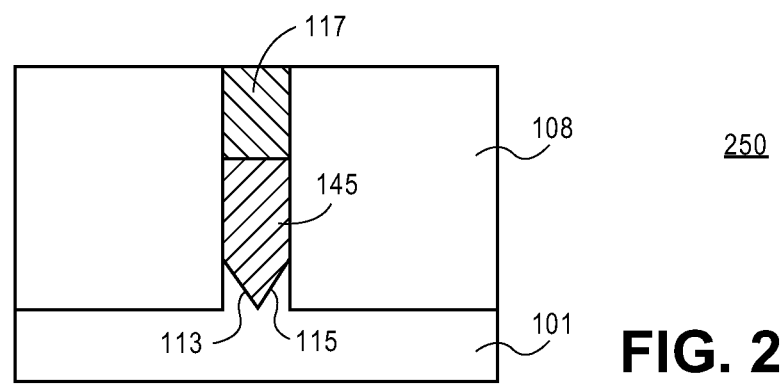
FIG. 2F shows a cross-sectional view of the portion of the electronic device shown in FIG. 1F along an axis A-A' according to one embodiment.

FIG. 1F is a view 150 similar to FIG. 1E after a fin layer 117 is deposited within the shallow trench 142 on the recessed portion 145 of the subfin layer according to one embodiment. FIG. 2F shows a cross-sectional view 250 of the portion of the electronic device shown in FIG. 1F along an axis A-A' according to one embodiment. In one embodiment, the fin layer comprises a semiconductor material other than the semiconductor material of the subfin layer 145. In one embodiment, the VBO between the fin layer 117 and the recessed portion 145 of the subfin layer 114 is greater than 0.4 eV. In one embodiment, the fin layer 117 and the recessed portion 145 of the subfin layer 114 have similar lattice constants. In one embodiment, the lattice mismatch between the fin layer 117 and the recessed portion 145 of the subfin layer 114 is less than about 0.1%. In one embodiment, the fin layer 117 is a germanium layer. In alternative embodiments, the fin layer 117 is other semiconductor layer, e.g., SiGe, and GeSn.

In one embodiment, the fin layer 117 is grown on the recessed portion of the subfin layer 114 within the shallow trench 142 using one of the CVD or MOCVD techniques known to one of ordinary skill in the art of electronic device manufacturing. The fin layer 117 is then planarized using one of the CMP techniques known to one of ordinary skill in the art of electronic device manufacturing to flush with the insulating layer 108.

Figure 1G:
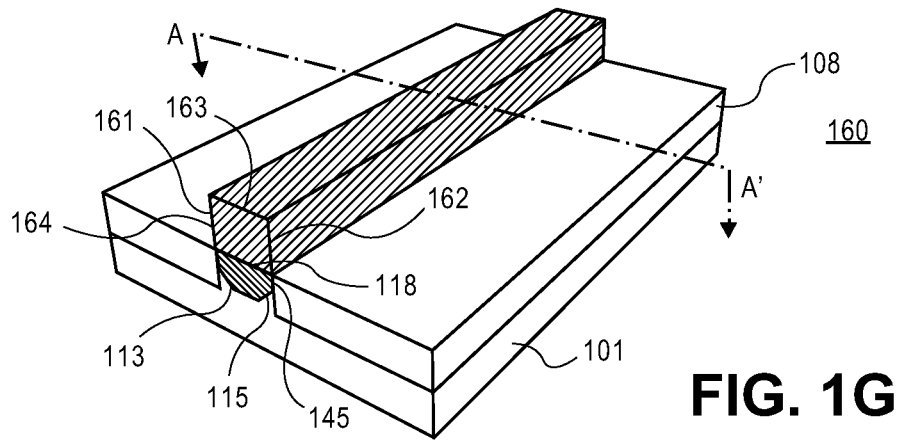
FIG. 1G is a view similar to FIG. 1F after the insulating layer is recessed according to one embodiment.
Figure 2G:
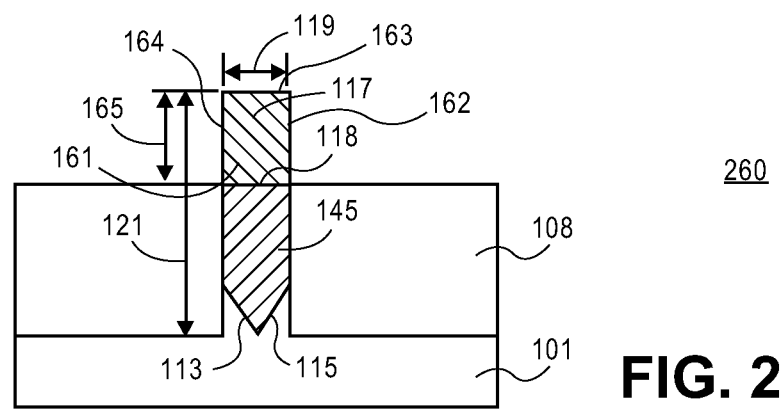
FIG. 2G shows a cross-sectional view of the portion of the electronic device shown in FIG. 1G along an axis A-A' according to one embodiment.

FIG. 1G is a view 160 similar to FIG. 1F after the insulating layer 108 is recessed according to one embodiment. FIG. 2G shows a cross-sectional view 260 of the portion of the electronic device shown in FIG. 1G along an axis A-A' according to one embodiment. In one embodiment, the insulating layer 108 is recessed down to the recessed portion of the subfin layer 114. In one embodiment, the insulating layer 108 is recessed down to an interface 118 between the fin layer 117 and the recessed portion of the subfin layer 114. A fin 161 comprising a top portion 163 and opposing sidewalls 162 and 164 is formed on subfin layer 145. In one embodiment, the fin 161 acts a channel of the non-planar transistor. In one embodiment, a width 119 of the fin 161 is not greater than 100 nm. In one embodiment, the width 119 is from about 1 nm to about 200 nm. In more specific embodiment, the width 119 is from about 5 nm to about 20 nm. In more specific embodiment, the width 119 is about 10 nm. In one embodiment, a height 165 of the fin 161 is from about 2 nm to about 100 nm. In more specific embodiment, the height 165 is about 40 nm. In one embodiment, a total height 121 of the fin 161 and the subfin layer 145 is from about 100 nm to about 1000 nm.

In one embodiment, the insulating layer 108 is recessed by a timed etch using one or more of the dry and wet etching techniques known to one of ordinary skill in the art of electronic device manufacturing. In one embodiment, after forming the fin 161, the process follows a transistor process flow, or other device process flow to complete device fabrication. In more specific embodiment, after forming the fin 161, the process follows a replacement metal gate process flow to complete device fabrication, as described in further detail below.

Figure 1H:
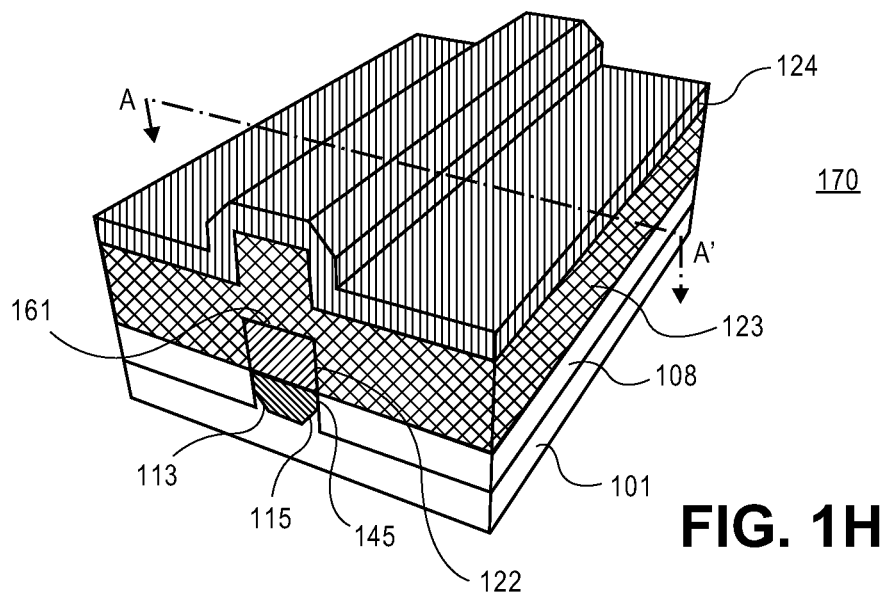
FIG. 1H is a view similar to FIG. 1G after a hard mask layer is deposited on a polysilicon layer on a dummy oxide layer on the fin according to one embodiment.
Figure 2H:
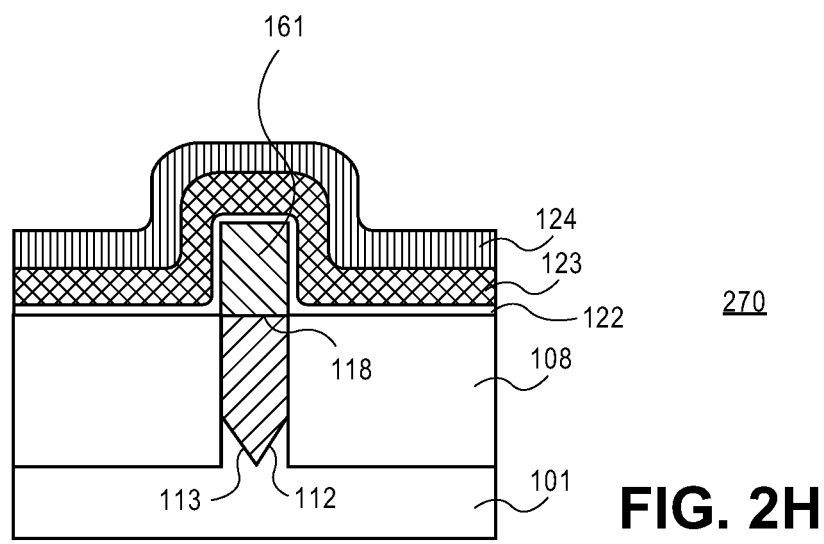
FIG. 2H shows a cross-sectional view of the portion of the electronic device shown in FIG. 1H along an axis A-A' according to one embodiment.

FIG. 1H is a view 170 similar to FIG. 1G after a hard mask layer 124 is deposited on a polysilicon layer 123 on a dummy oxide layer 122 on the fin 161 according to one embodiment. FIG. 2H shows a cross-sectional view 270 of the portion of the electronic device shown in FIG. 1H along an axis A-A' according to one embodiment. A dummy oxide layer 122 is deposited on insulating layer 108 and the top portion and the opposing sidewalls of the fin 161. In one embodiment, dummy oxide layer 122 is a silicon oxide, an aluminum oxide, a silicon oxide nitride, other oxide layer, or any combination thereof. In one embodiment, dummy oxide layer 122 is deposited using one of the deposition techniques, such as but not limited to a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

A polysilicon layer 123 is deposited on dummy oxide layer 122. In one embodiment, polysilicon layer 123 is deposited using one of the deposition techniques, such as but not limited to a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

A hard mask layer 124 is deposited on polysilicon layer 123. In one embodiment, hard mask layer 124 is a nitride layer, e.g., a silicon nitride, a silicon oxide nitride, or any other hard mask layer known to one of ordinary skill in the art of electronic device manufacturing. Hard mask layer 124 can be deposited using one of the hard mask layer deposition techniques known to one of ordinary skill in the art of electronic device manufacturing.

Figure 1I:
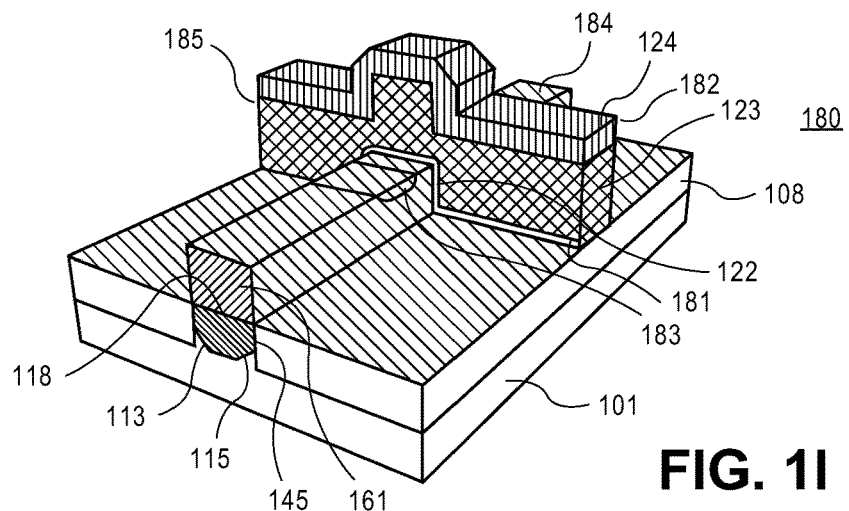
FIG. 1I is a view similar to FIG. 1H after a dummy gate is formed according to one embodiment.

FIG. 1I is a view 180 similar to FIG. 1H after a dummy gate 185 is formed according to one embodiment. Dummy gate 185 is formed by patterning and etching the hard mask layer 124 on polysilicon layer 123 using one or more patterning and etching techniques known to one of ordinary skill in the art of electronic device manufacturing. Spacers (not shown) are formed on the opposite sidewalls 181 and 182 of the dummy gate 185 by using one of the spacer deposition and etching techniques known to one of ordinary skill of electronic device manufacturing.

A source region 183 and a drain region 184 are formed on fin 161 at opposing sides of the gate 185. Source region 183 and drain region 184 are formed using one of the source and drain region forming techniques known to one of ordinary skill in the art of electronic device manufacturing.

Figure 1J:
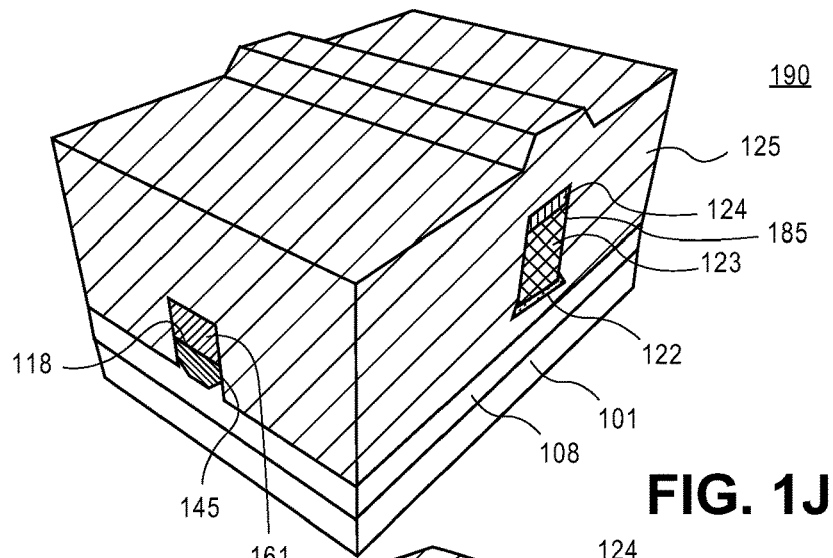
FIG. 1J is a view similar to FIG. 1I after an insulating layer is deposited on the gate, the spacers, the insulating layer and fin according to one embodiment.

FIG. 1J is a view 190 similar to FIG. 1I after an insulating layer 125 is deposited on gate 185, the spacers (not shown), the insulating layer 108 and fin 161 according to one embodiment. In one embodiment, insulating layer comprises an interlayer dielectric (ILD) layer (e.g., an oxide layer). In another embodiment, insulating layer comprises an etch stop layer e.g., a nitride etch stop layer (NESL). In one embodiment, insulating layer 125 comprises an ILD layer deposited on a NESL layer. In alternative embodiments, insulating layer 125 is an oxide layer, e.g., a silicon oxide, an aluminum oxide, a silicon oxide nitride, a nitride layer, e.g., a silicon nitride, a silicon oxide nitride, other insulating layer, or any combination thereof. Insulating layer 125 can be deposited using one of the deposition techniques such as but not limited to a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

Figure 1K:
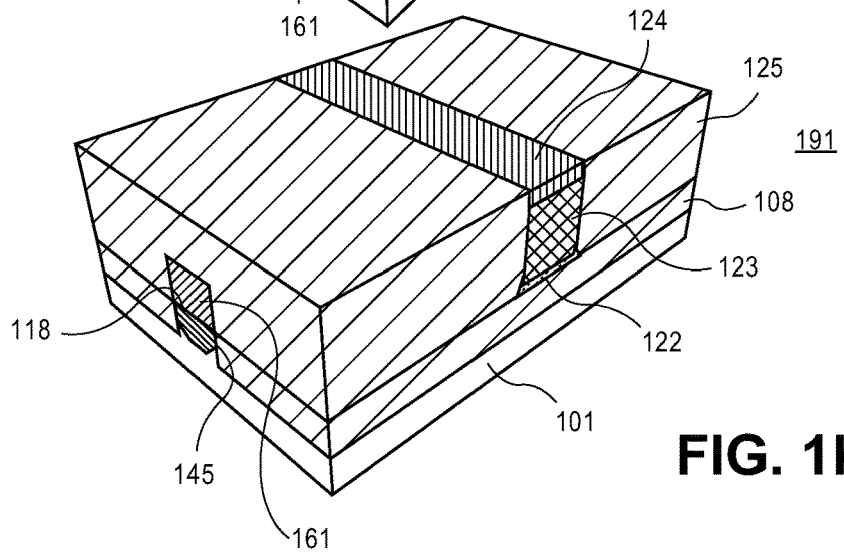
FIG. 1K is a view similar to FIG. 1J after the insulating layer is recessed to expose a top surface of the hard mask layer according to one embodiment.

FIG. 1K is a view 191 similar to FIG. 1J after insulating layer 125 is recessed to expose a top surface of the hard mask layer 124 according to one embodiment. In one embodiment, the insulating layer 125 is planarized using one of the CMP techniques known to one of ordinary skill in the art of electronic device manufacturing. In one embodiment, the insulating layer 125 is etched using one of the etching techniques known to one of ordinary skill in the art of electronic device manufacturing.

Figure 1L:
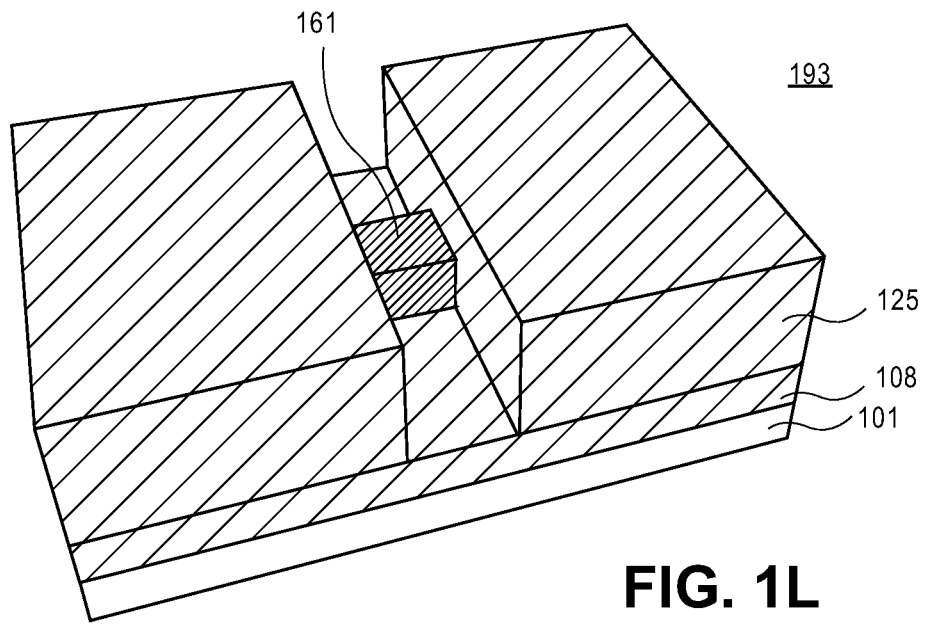
FIG. 1L is a view similar to FIG. 1K after the dummy gate and dummy oxide layer are removed to expose a portion of the fin according to one embodiment.

FIG. 1L is a view 193 similar to FIG. 1K after dummy gate 185 and dummy oxide layer 122 are removed to expose a portion of the fin 161 according to one embodiment. Dummy gate 185 and dummy oxide layer 122 are removed using one or more patterning and etching techniques known to one of ordinary skill in the art of electronic device manufacturing. In one embodiment, the hard mask portion of the dummy gate is removed using one of dry etching techniques known to one of ordinary skill in the art of electronic device manufacturing. In one embodiment, the polysilicon portion of the dummy gate is removed using one of etching techniques known to one of ordinary skill in the art of electronic device manufacturing. In one embodiment, the dummy oxide layer is removed by etching with a hydrofluoric acid (HF), or other etching techniques known to one of ordinary skill in the art of electronic device manufacturing.

Figure 1M:
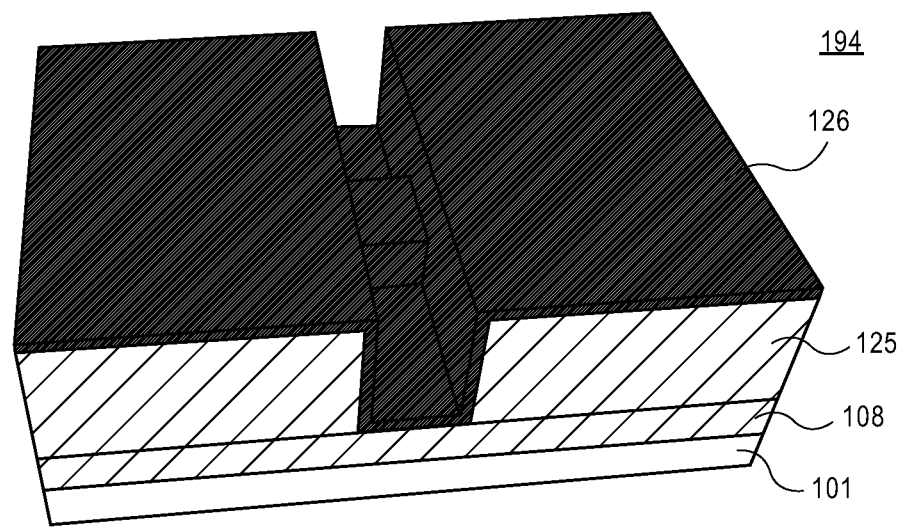
FIG. 1M is a view similar to FIG. 1L after a gate dielectric layer is deposited on the insulating layer according to one embodiment.

FIG. 1M is a view 194 similar to FIG. 1L after a gate dielectric layer 126 is deposited on insulating layer 125 according to one embodiment. In one embodiment, the gate dielectric layer 126 is a high-k dielectric layer. In one embodiment, gate dielectric layer 126 is an oxide layer, e.g., a zirconium oxide ("$ZrO_2$"), a hafnium oxide ("$HFO_2$") lanthanum oxide ("$La_2O_4$"), or other oxide layer known to one of ordinary skill in the art of electronic device manufacturing. Gate dielectric layer 126 can be deposited using one of the deposition techniques such as but not limited to a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

Figure 1N:
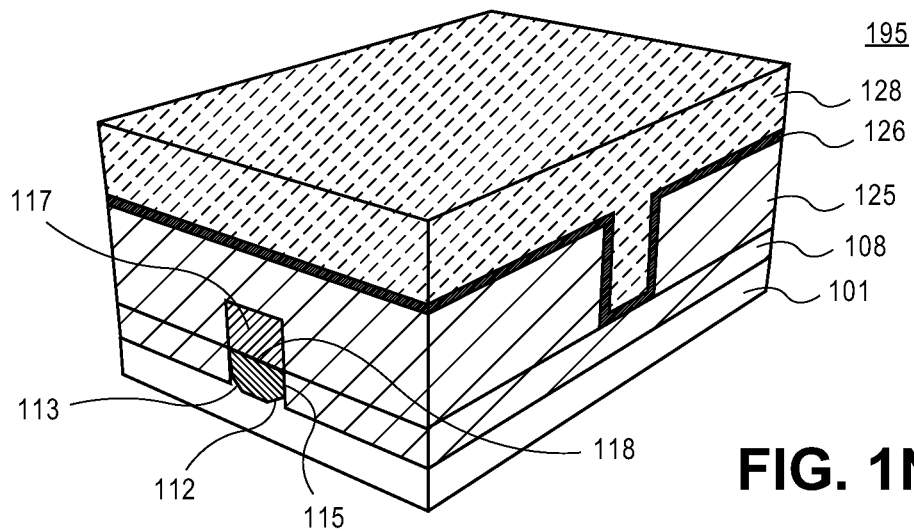
FIG. 1N is a view similar to FIG. 1M after a conductive layer is deposited on the gate dielectric layer according to one embodiment.

FIG. 1N is a view 195 similar to FIG. 1M after a conductive layer 128 is deposited on gate dielectric layer 126 according to one embodiment. In one embodiment, conductive layer 128 is a metal layer. In one embodiment, conductive layer 128 comprises one or more metals, e.g., tungsten, tantalum, titanium, hafnium, zirconium, aluminum, silver, tin, lead, copper, metal alloys, metal carbides, e.g., hafnium carbide, zirconium carbide, titanium carbide, tantalum carbide, aluminum carbide, other conductive materials, or any combination thereof.

The conductive layer 128 can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

Figure 1O:
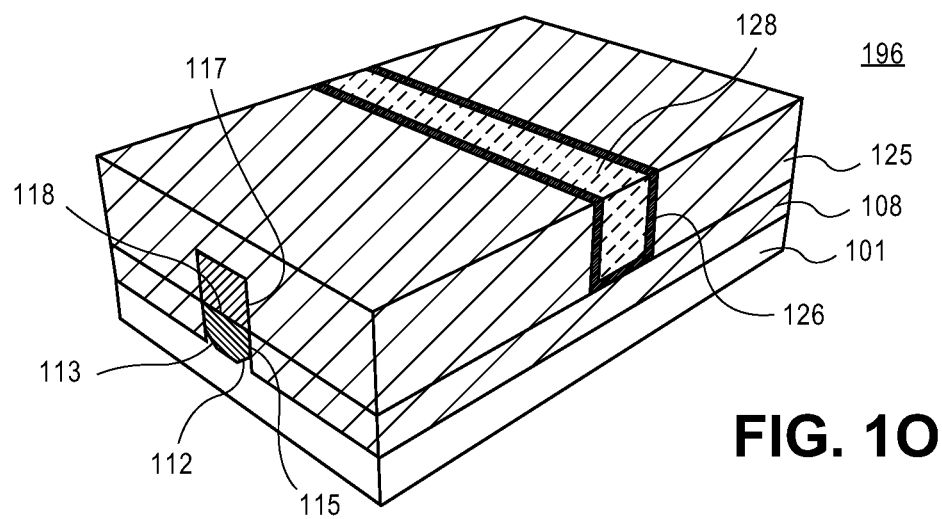
FIG. 1O is a view similar to FIG. 1N after portions of the conductive layer and gate dielectric layer are removed to form a gate according to one embodiment.

FIG. 1O is a view 196 similar to FIG. 1N after portions of the conductive layer 128 and gate dielectric layer 126 are removed to form a gate according to one embodiment. As shown in FIG. 2O, the conductive layer 128 and gate dielectric layer 126 are flushed with the insulating layer 125. In one embodiment, the portions of the conductive layer 128 and gate dielectric layer 126 are removed from top portions of the insulating layer 125 using one of the CMP techniques known to one of ordinary skill in the art of electronic device manufacturing. In another embodiment, the portions of the conductive layer 128 are removed using one of conductive layer etching techniques known to one of ordinary skill in the art of electronic device manufacturing. In another embodiment, portions of the gate dielectric layer 126 are removed using one of gate dielectric layer etching techniques known to one of ordinary skill in the art of electronic device manufacturing.

Figure 1P:
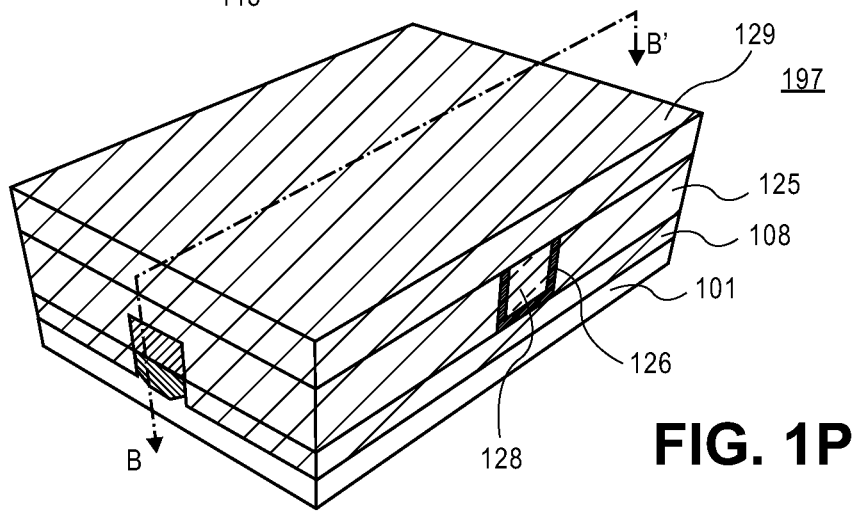
FIG. 1P is a view similar to FIG. 1N after a capping oxide layer is deposited on the conductive layer, gate dielectric layer and insulating layer according to one embodiment.
Figure 2I:
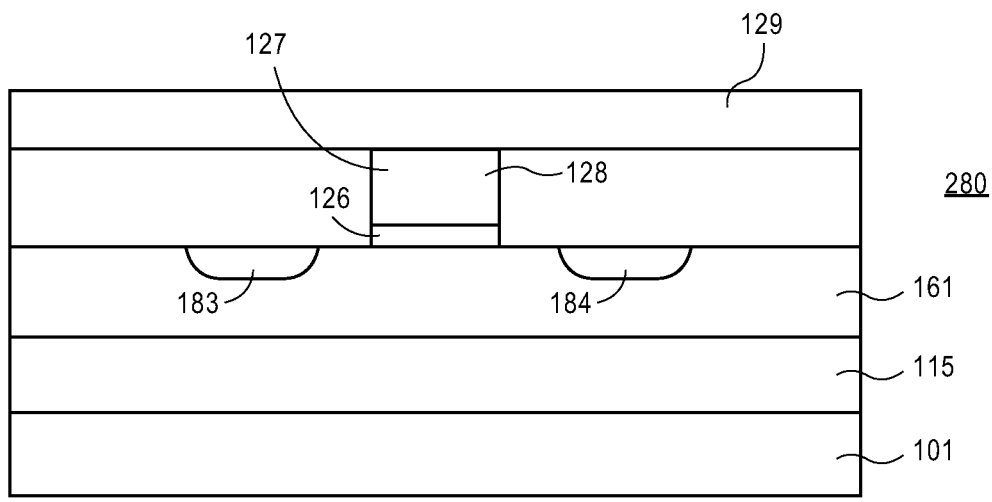
FIG. 2I shows a cross-sectional view of the portion of the electronic device shown in FIG. 1P along an axis B-B' according to one embodiment.

FIG. 1P is a view 197 similar to FIG. 1N after a capping oxide layer 129 is deposited on the conductive layer 128, gate dielectric layer 126 and insulating layer 125 according to one embodiment. FIG. 2I shows a cross-sectional view 280 of the portion of the electronic device shown in FIG. 1P along an axis B-B' according to one embodiment. In one embodiment, capping oxide layer 129 comprises a silicon oxide, an aluminum oxide, a silicon oxide nitride, other oxide layer, or any combination thereof.

As shown in FIG. 2I, source region 183 and drain region are formed on fin 161 at opposing sides of a gate portion 127. Gate portion 127 comprises the conductive layer 128. The conductive layer 128 is deposited on gate dielectric layer 126 on fin 161 on subfin layer 115 on substrate 101.

Figure 2J:
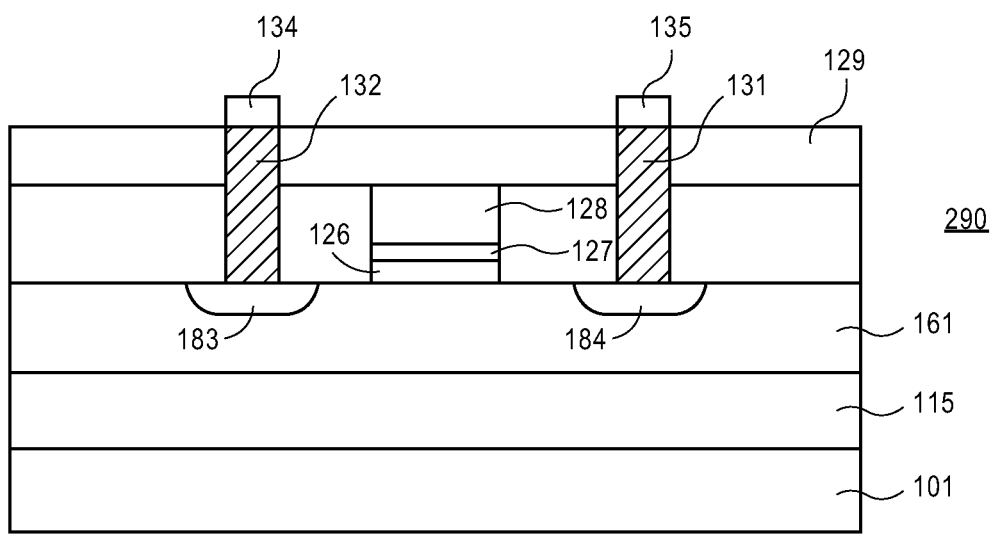
FIG. 2J is a view similar to FIG. 2I after contacts are formed according to one embodiment.

FIG. 2J is a view 290 similar to FIG. 2I after contacts 134 and 135 are formed according to one embodiment. As shown in FIG. 2J, a contact 134 is formed on an interconnect 132 to electrically connect to source region 183 and a contact 135 is formed on an interconnect 131 to connect to drain region 184. The contacts and interconnects are formed using one or more contact patterning and deposition techniques known to one of ordinary skill in the art of electronic device manufacturing.

Figure 3A:
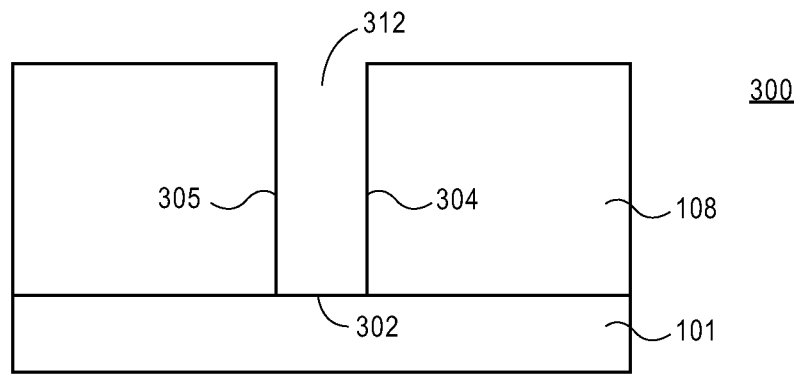
FIG. 3A is a view similar to FIG. 2B after a fin is etched to form a narrow trench according to another embodiment.

FIG. 3A is a view 300 similar to FIG. 2B after a fin is etched to form a narrow trench according to another embodiment. As shown in FIG. 3A, a trench 312 is formed in insulating layer 108 on substrate 101. Trench 312 has sidewalls 304 and 305 and a bottom portion 302 substantially parallel to the substrate 101. The trench 312 is formed by removing the fin 102 using a dry etching, a wet etching, or both dry and etching techniques, as described above with respect to FIG. 2C.

In one embodiment, the width of the trench 312 is from about 1 nm to about 200 nm. In one embodiment, the width of the trench 312 is not greater than 100 nm. In more specific embodiment, the width 221 is from about 5 nm to about 20 nm. In one embodiment, the depth of the trench 312 is at least twice greater than the width to provide the ART.

Figure 3B:
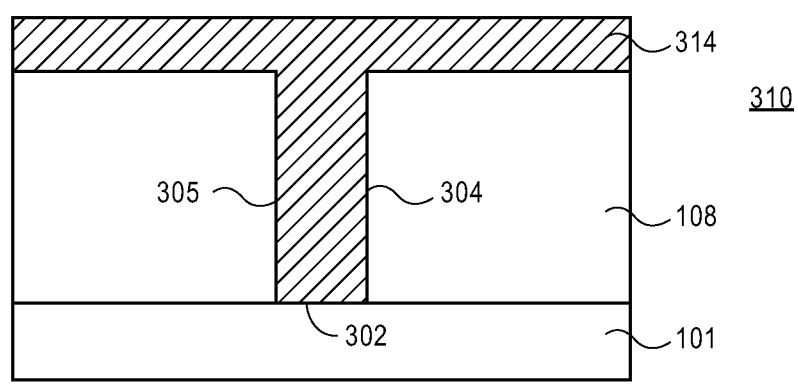
FIG. 3B is a view similar to FIG. 3A after a subfin layer is deposited within the trench in the insulating layer on the substrate according to another embodiment.

FIG. 3B is a view 310 similar to FIG. 3A after a subfin layer 314 is deposited within the trench 312 in the insulating layer 108 on the substrate 101 according to another embodiment. Subfin layer 314 is deposited on bottom portion 302 on the substrate 101, sidewalls 305 and 304, and top portions of the insulating layer 108 to ensure a complete fill of the trench 312. In one embodiment, the subfin layer 314 represents subfin layer 114 described above.

Subfin layer 314 can be deposited using one of deposition techniques, such as but not limited to a chemical vapour deposition ("CVD"), e.g., a plasma Enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 3C:
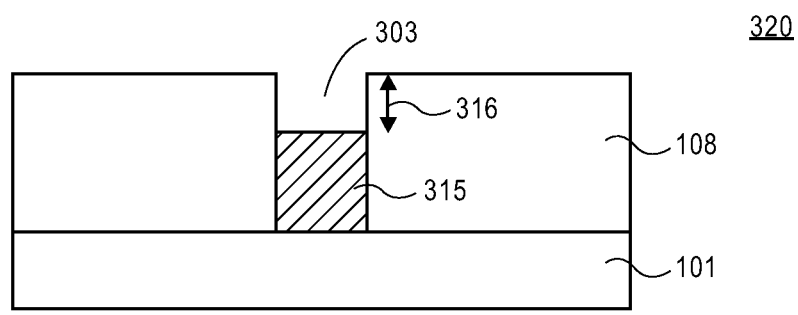
FIG. 3C is a view similar to FIG. 3B after the subfin layer is recessed according to another embodiment.

FIG. 3C is a view 320 similar to FIG. 3B after the subfin layer 314 is recessed according to another embodiment. The subfin layer 314 is recessed within the trench 312 to a depth 316 to form a shallow trench 303. In one embodiment, a depth 316 of the trench 303 is determined by the thickness of a channel body formed later in a process. In one embodiment, depth 316 is from about 2 nm to about 100 nm. In more specific embodiment, depth 316 is about 40 nm. In one embodiment, the subfin layer 314 is planarized using one of the CMP techniques known to one of ordinary skill in the art of electronic device manufacturing so that the subfin layer is flushed with the insulating layer 108. The subfin layer is then recessed within the trench 312 to form a recessed portion 315 by using a wet etching, dry etching, or both etching techniques known to one of ordinary skill in the art of electronic device manufacturing. In one embodiment, the subfin layer is recessed by a wet etch using ammonia hydroxide based solution. In another embodiment, the subfin layer is recessed by a dry etch using one or more halogen based chemistries (e.g., Cl2, HBr, or any combination thereof).

Figure 3D:
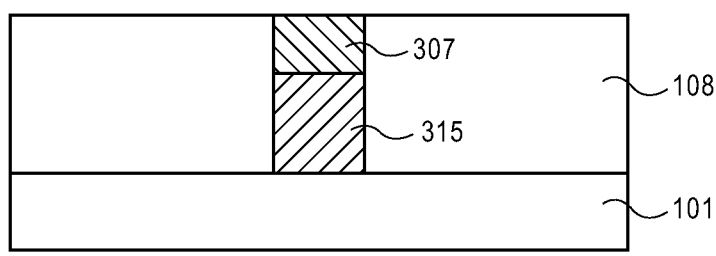
FIG. 3D is a view similar to FIG. 3C after a fin layer is deposited within a shallow trench on the recessed portion of the subfin layer according to another embodiment.

FIG. 3D is a view 330 similar to FIG. 3C after a fin layer 316 is deposited within the shallow trench 303 on the recessed portion 315 of the subfin layer according to another embodiment. In one embodiment, the fin layer 316 represents the fin layer 117 described above. In one embodiment, the fin layer 316 is grown on the recessed portion 315 within the shallow trench 303 using one of the CVD or MOCVD techniques known to one of ordinary skill in the art of electronic device manufacturing. The fin layer 316 is then planarized using one of the CMP techniques known to one of ordinary skill in the art of electronic device manufacturing to flush with the insulating layer 108.

Figure 3E:
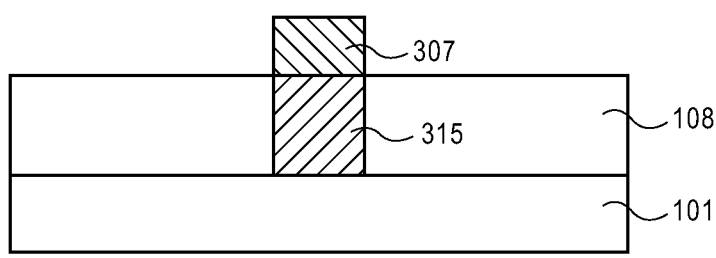
FIG. 3E is a view similar to FIG. 3D after the insulating layer is recessed according to another embodiment.

FIG. 3E is a view 340 similar to FIG. 3D after the insulating layer 108 is recessed according to another embodiment. In one embodiment, the insulating layer 108 is recessed down to the recessed portion 315 of the subfin layer. In one embodiment, the insulating layer 108 is recessed down to an interface between the fin layer 316 and the recessed portion of the subfin layer 315. A fin 341 comprising a top portion 342 and opposing sidewalls 343 and 344 is formed on the recessed portion of subfin layer 315. In one embodiment, the fin 341 acts a channel of the non-planar transistor. In one embodiment, the width of the fin 341 is not greater than 100 nm. In one embodiment, the width of the fin 341 is from about 1 nm to about 200 nm. In more specific embodiment, the width of the fin 341 is from about 5 nm to about 20 nm. In more specific embodiment, the width of the fin 341 is about 10 nm. In one embodiment, the height of the fin 341 is from about 2 nm to about 100 nm. In more specific embodiment, the height of the fin 314 is about 40 nm. In one embodiment, the total height of the fin 314 and the subfin layer 315 is from about 100 nm to about 1000 nm. In one embodiment, the insulating layer 108 is recessed by a timed etch using one or more of the dry and wet etching techniques known to one of ordinary skill in the art of electronic device manufacturing. In one embodiment, after forming the fin 307, the process follows a transistor process flow, or other device process flow to complete device fabrication. In more specific embodiment, after forming the fin 307, the process follows a replacement metal gate process flow to complete device fabrication, as described above.

Figure 4:
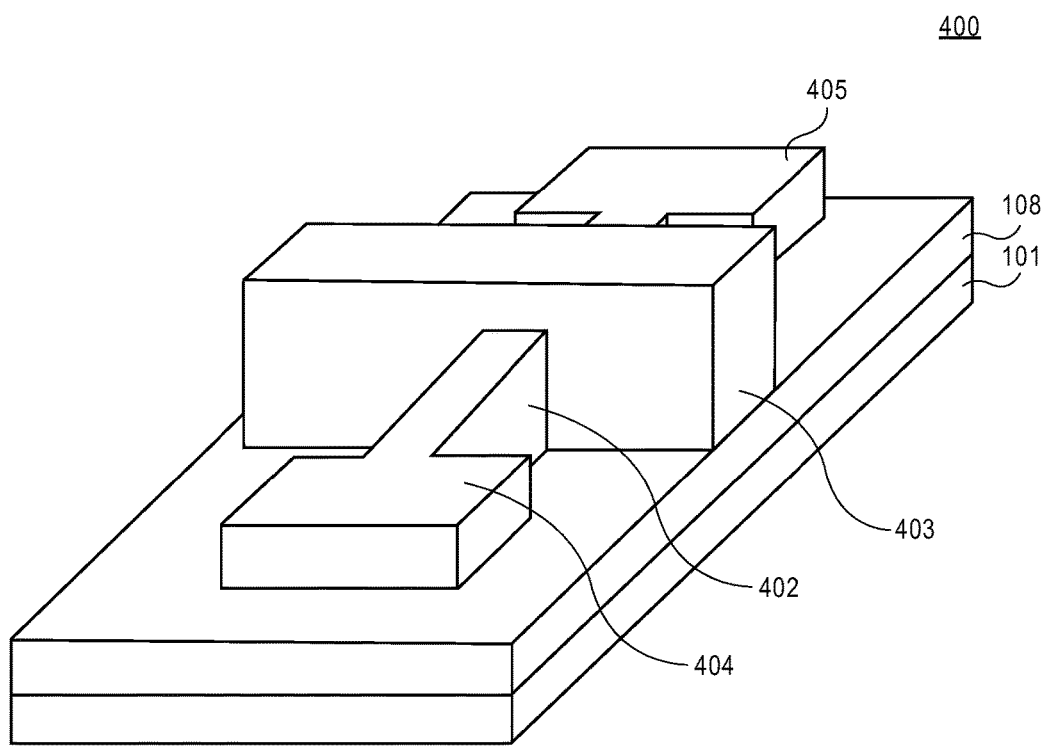
FIG. 4 is a perspective view of a fin structure according to one embodiment of the invention.

FIG. 4 is a perspective view of a fin structure 400 according to one embodiment of the invention. A fin 402 is formed on a subfin layer (not shown) on substrate 101, as described above. In one embodiment, the subfin layer is formed in a trench in insulating layer 108 on substrate 101, as described above. The subfin layer is represented by one of the subfin layers described above. The fin 402 is represented by one of the fins 161 and 307 described above. In an embodiment, fin structure 400 is a part of a tri-gate transistor. As shown in FIG. 4, the fin 402 protrudes from a top surface of the substrate 101. A gate dielectric layer (not shown) is deposited on the opposing sidewalls and on the top surface of the fin 402. As shown in FIG. 4, a gate electrode 403 is deposited on the gate dielectric layer on the fin 402, as described above. Gate electrode 403 is formed on and around the gate dielectric layer on the fin 402 as shown in FIG. 4. A drain region 405 and a source region 404 are formed at opposite sides of the gate electrode 403 in fin 402, as shown in FIG. 4.

Figure 5:
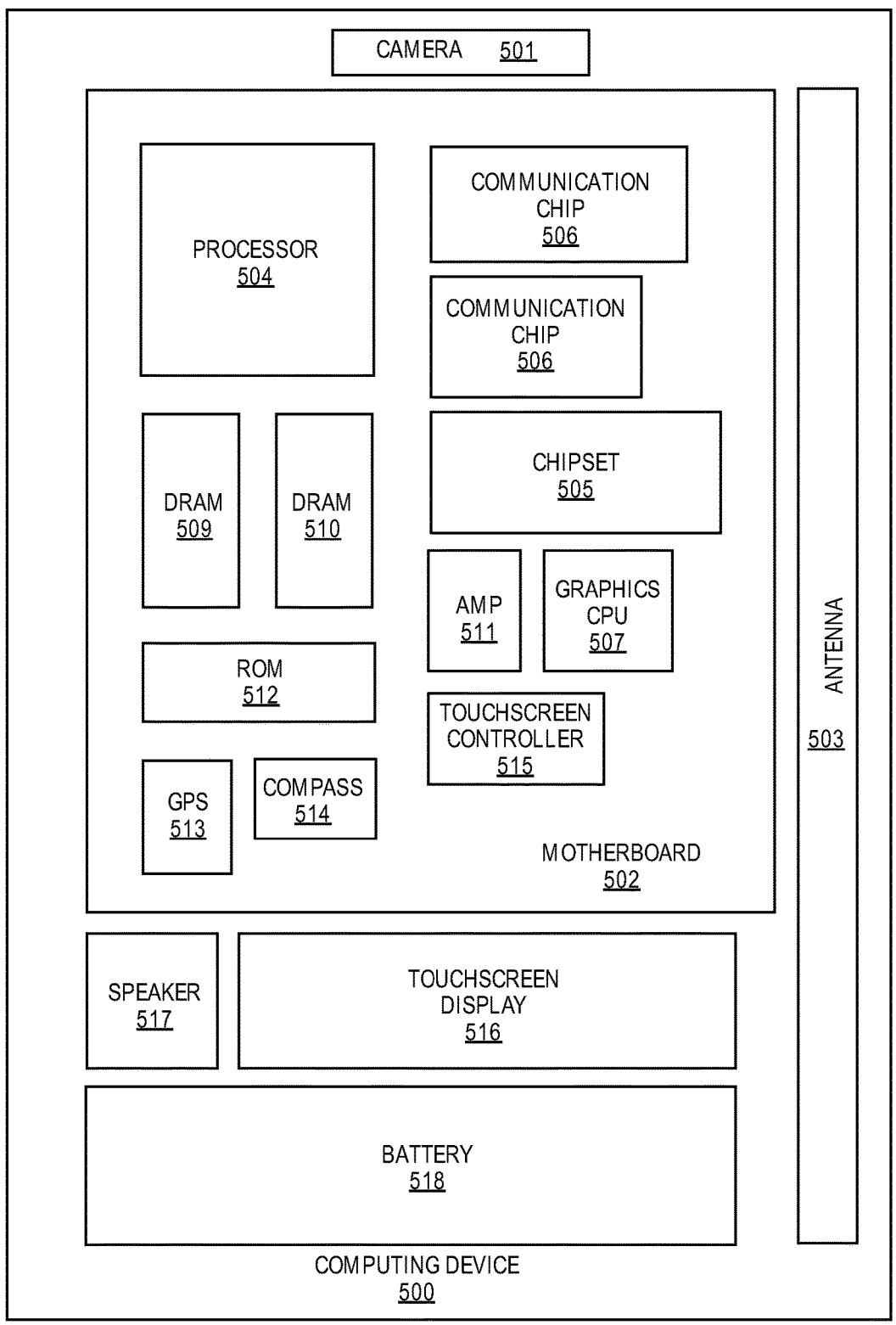
FIG. 5 illustrates a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., a DRAM 509, a DRAM 510), non-volatile memory (e.g., a ROM 512), flash memory, a graphics processor (e.g., a Graphics CPU 507), a digital signal processor, a crypto processor, a chipset 505, an antenna 503, a display, a touchscreen display 516, a touchscreen controller 515, a battery 518, an audio codec, a video codec, a power amplifier 511, a global positioning system (GPS) device 513, a compass 514, an accelerometer, a gyroscope, a speaker 517, a camera 501, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as transistors comprising a subfin layer built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as transistors comprising a subfin layer built in accordance with implementations of the invention.

In further implementations, another component housed within the computing device 200 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The following examples pertain to further embodiments:

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material.

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material. A valence band offset between the first semiconductor material and the III-V semiconductor material is greater than 0.25 eV.

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material. The first semiconductor material and the III-V semiconductor material have similar lattice constants.

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material. The first semiconductor material comprises germanium. The III-V semiconductor material comprises gallium arsenide.

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material. The subfin layer is deposited within a trench in an insulating layer on the substrate.

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material. The width of the fin is less than 20 nm.

In one embodiment, an electronic device comprises a subfin layer on a substrate. A fin is on the subfin layer. The fin comprises a top portion and opposing sidewalls. The fin comprises a first semiconductor material, and the subfin layer comprises a III-V semiconductor material. A gate dielectric layer is on the top portion and the opposing sidewalls of the fin. A gate electrode is deposited on the gate dielectric layer. A source region and a drain region are formed on the fin at opposing sides of the gate electrode.

In one embodiment, a transistor comprises a trench in an insulating layer on a substrate. A subfin layer is deposited in the trench. A fin comprising a top portion and opposing sidewalls is deposited on the subfin layer. The fin comprises a semiconductor material. The subfin layer comprises a semiconductor material. A valence band offset between the semiconductor material of the fin and the semiconductor material of the subfin layer is greater than 0.5 eV.

In one embodiment, In one embodiment, a transistor comprises a trench in an insulating layer on a substrate. A subfin layer is deposited in the trench. A fin comprising a top portion and opposing sidewalls is deposited on the subfin layer. The fin comprises a semiconductor material. The subfin layer comprises a semiconductor material. A valence band offset between the semiconductor material of the fin and the semiconductor material of the subfin layer is greater than 0.5 eV. The semiconductor material of the fin comprises germanium and the semiconductor material of the subfin layer comprises a III-V semiconductor material.

In one embodiment, a transistor comprises a trench in an insulating layer on a substrate. A subfin layer is deposited in the trench. A fin comprising a top portion and opposing sidewalls is deposited on the subfin layer. The fin comprises a semiconductor material. The subfin layer comprises a semiconductor material. A valence band offset between the semiconductor material of the fin and the semiconductor material of the subfin layer is greater than 0.5 eV. The semiconductor material of the fin and the semiconductor material of the subfin layer have similar lattice constants.

In one embodiment, a transistor comprises a trench in an insulating layer on a substrate. A subfin layer is deposited in the trench. A fin comprising a top portion and opposing sidewalls is deposited on the subfin layer. The fin comprises a semiconductor material. The subfin layer comprises a semiconductor material. A valence band offset between the semiconductor material of the fin and the semiconductor material of the subfin layer is greater than 0.5 eV. The height of the trench is at least twice greater than the width of the trench.

In one embodiment, a transistor comprises a trench in an insulating layer on a substrate. A subfin layer is deposited in the trench. A fin comprising a top portion and opposing sidewalls is deposited on the subfin layer. The fin comprises a semiconductor material. The subfin layer comprises a semiconductor material. A valence band offset between the semiconductor material of the fin and the semiconductor material of the subfin layer is greater than 0.5 eV. The trench comprises a V-shape.

In one embodiment, a transistor comprises a trench in an insulating layer on a substrate. A subfin layer is deposited in the trench. A fin comprising a top portion and opposing sidewalls is deposited on the subfin layer. The fin comprises a semiconductor material. The subfin layer comprises a semiconductor material. A valence band offset between the semiconductor material of the fin and the semiconductor material of the subfin layer is greater than 0.5 eV. A gate dielectric layer on the top portion and opposing sidewalls of the fin. A gate electrode on the gate dielectric layer. A source region and a drain region at opposing sides of the gate electrode on the fin.

In one embodiment, a method to manufacture an electronic device comprises depositing a subfin layer comprising a III-V semiconductor material into a trench in an insulating layer on a substrate, and forming a fin comprising a semiconductor material on the subfin layer, the fin comprising a top portion and opposing sidewalls.

In one embodiment, a method to manufacture an electronic device comprises forming a dummy fin on the substrate, the dummy fin comprising a top portion and opposing sidewalls, depositing an insulating layer on the substrate adjacent to the opposing sidewalls of the dummy fin, etching the dummy fin to form a trench, depositing a subfin layer comprising a III-V semiconductor material into the trench, and forming a device fin comprising a first semiconductor material on the subfin layer, the device fin comprising a top portion and opposing sidewalls.

In one embodiment, a method to manufacture an electronic device comprises depositing a subfin layer comprising a III-V semiconductor material into a trench in an insulating layer on a substrate, and forming a fin comprising a semiconductor material on the subfin layer, the fin comprising a top portion and opposing sidewalls. A valence band offset between the semiconductor material of the fin and the III-V semiconductor material is greater than 0.5 eV.

In one embodiment, a method to manufacture an electronic device comprises depositing a subfin layer comprising a III-V semiconductor material into a trench in an insulating layer on a substrate, and forming a fin comprising a semiconductor material on the subfin layer, the fin comprising a top portion and opposing sidewalls. The semiconductor material of the fin and the III-V semiconductor material have similar lattice constants.

In one embodiment, a method to manufacture an electronic device comprises depositing a subfin layer comprising a III-V semiconductor material into a trench in an insulating layer on a substrate, and forming a fin comprising a semiconductor material on the subfin layer, the fin comprising a top portion and opposing sidewalls. The semiconductor material of the fin comprises germanium; and the III-V semiconductor material comprises gallium arsenide.

In one embodiment, a method to manufacture an electronic device comprises
depositing a subfin layer comprising a III-V semiconductor material into a trench in an insulating layer on a substrate, and forming a fin comprising a semiconductor material on the subfin layer, the fin comprising a top portion and opposing sidewalls, and recessing the insulating layer.

In one embodiment, a method to manufacture an electronic device comprises depositing a subfin layer comprising a III-V semiconductor material into a trench in an insulating layer on a substrate, and forming a fin comprising a semiconductor material on the subfin layer, the fin comprising a top portion and opposing sidewalls, depositing a gate dielectric layer on the top portion and opposing sidewalls of the fin, and forming a source region and a drain region at opposing sides of a gate electrode on the fin.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:
1. An electronic device, comprising:
   a trench in an insulating layer on a substrate, the insulating layer having a bottom surface;
   a subfin layer in the trench, the subfin layer comprising a III-V semiconductor material, the III-V semiconductor material of the subfin layer having a bottom surface co-planar with the bottom surface of the insulating layer; and
   a fin on the subfin layer, the fin comprising a top portion and opposing sidewalls, the fin comprising a first semiconductor material.
2. The electronic device of claim 1, wherein a valence band offset between the first semiconductor material and the III-V semiconductor material of the subfin layer is greater than 0.25 eV.

3. The electronic device of claim 1, wherein the first semiconductor material and the III-V semiconductor material of the subfin layer have similar lattice constants.

4. The electronic device of claim 1, wherein the first semiconductor material comprises germanium; and the III-V semiconductor material of the subfin layer comprises gallium arsenide.

5. The electronic device of claim 1, wherein the width of the fin is less than 20 nm.

6. The electronic device of claim 1, further comprising
a gate dielectric layer on the top portion and the opposing sidewalls; and
a source region and a drain region on the fin.

7. A transistor, comprising:
a trench in an insulating layer on a substrate, the insulating layer having a bottom surface;
a subfin layer in the trench, the subfin layer comprising a III-V semiconductor material, the III-V semiconductor material of the subfin layer having a bottom surface co-planar with the bottom surface of the insulating layer;
a fin comprising a top portion and opposing sidewalls on the subfin layer, the fin comprising a first semiconductor material, wherein a valence band offset between the first semiconductor material and the III-V material of the subfin layer is greater than 0.25 eV.

8. The transistor of claim 7, wherein the first semiconductor material comprises germanium.

9. The transistor of claim 7, wherein the first semiconductor material and the III-V material of the subfin layer have similar lattice constants.

10. The transistor of claim 7, wherein the height of the trench is at least twice greater than the width of the trench.

11. The transistor of claim 7, wherein the trench comprises a V-shape.

12. The transistor of claim 7, further comprising
a gate dielectric layer on the top portion and opposing sidewalls; and
a source region and a drain region at opposing sides of a gate electrode on the fin.

13. A method to manufacture an electronic device, comprising:
depositing a subfin layer layer comprising a III-V semiconductor material into a trench in an insulating layer on a substrate, the insulating layer having a bottom surface, and the III-V semiconductor material of the subfin layer having a bottom surface co-planar with the bottom surface of the insulating layer; and
forming a first fin comprising a first semiconductor material on the subfin layer, the first fin comprising a first top portion and first opposing sidewalls.

14. The method of claim 13, further comprising
forming a second fin on the substrate, the second fin comprising a second top portion and second opposing sidewalls;
depositing an insulating layer on the substrate adjacent to the second opposing sidewalls; and
etching the second fin.

15. The method of claim 13, wherein a valence band offset between the first semiconductor material and the III-V semiconductor material is greater than 0.24 eV.

16. The method of claim 13, wherein the first semiconductor material and the III-V semiconductor material have similar lattice constants.

17. The method of claim 13, wherein the first semiconductor material comprises germanium; and the III-V semiconductor material comprises gallium arsenide.

18. The method of claim 13, further comprising recessing the insulating layer.

19. The method of claim 13, further comprising
depositing a gate dielectric layer on the first top portion and first opposing sidewalls; and
forming a source region and a drain region at opposing sides of a gate electrode on the first fin.

* * * * *